United States Patent
Chang

(10) Patent No.: US 9,186,798 B2
(45) Date of Patent: Nov. 17, 2015

(54) MOVING FIXTURE AND RELATED MOVING APPARATUS

(71) Applicant: Wistron Corporation, New Taipei (TW)

(72) Inventor: Yao-Lin Chang, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 0 days.

(21) Appl. No.: 14/184,723

(22) Filed: Feb. 20, 2014

(65) Prior Publication Data

US 2015/0102619 A1  Apr. 16, 2015

(30) Foreign Application Priority Data

Oct. 16, 2013 (TW) .............................. 102219295 U

(51) Int. Cl.
  *B25J 15/06* (2006.01)
(52) U.S. Cl.
  CPC .................................. *B25J 15/0616* (2013.01)
(58) Field of Classification Search
  CPC . B25J 15/0616; B25J 15/0641; B25B 11/007; F16B 47/00; F16B 47/006
  USPC ................ 294/183, 187, 65; 901/40
  See application file for complete search history.

(56) References Cited

U.S. PATENT DOCUMENTS

| 1,773,498 | A | * | 8/1930 | Raymond | 294/187 |
| 2,303,393 | A | * | 12/1942 | Schmidt | 294/186 |
| 3,061,351 | A | * | 10/1962 | Johnson | 294/187 |
| 4,411,574 | A | * | 10/1983 | Riley | 414/796.3 |
| 6,488,321 | B1 | * | 12/2002 | Huang | 294/187 |
| 8,025,323 | B2 | * | 9/2011 | Ransom | 294/65 |
| 2004/0124325 | A1 | * | 7/2004 | Kwok | 248/205.8 |
| 2006/0226666 | A1 | * | 10/2006 | Chavda et al. | 294/64.1 |
| 2012/0104781 | A1 | * | 5/2012 | Finck | 294/65 |

FOREIGN PATENT DOCUMENTS

TW  M420697  1/2012

* cited by examiner

*Primary Examiner* — Dean Kramer
(74) *Attorney, Agent, or Firm* — Winston Hsu; Scott Margo

(57) ABSTRACT

A moving fixture capable of adjusting suction is disclosed in the present invention. The moving fixture includes a sucking component, a first supporting component, a second supporting component, a resilient component and a handle. A first end of the first supporting component is disposed on the sucking component. The second supporting component is movably disposed on a second end of the first supporting component opposite to the first end, and the second supporting component can move from the second end to the first end relative to the first supporting component. The resilient component is disposed between the first supporting component and the second supporting component. The handle is disposed on an end of the second supporting component opposite to the first supporting component.

18 Claims, 7 Drawing Sheets

MOVING FIXTURE AND RELATED MOVING APPARATUS

BACKGROUND OF THE INVENTION

1. Field of the Invention

The present invention relates to a moving fixture, and more particularly, to a moving fixture and a related moving apparatus capable of adjusting suction force.

2. Description of the Prior Art

Dimensions of the panel unit are increased according to a trend of the consumer market. The moving fixture is a tool for stably moving the panel unit. The conventional moving fixture includes a handle, a support arm and an adhesive disk. The support arm is made of rigid material. Ends of the support arm are respectively connected to the handle and the adhesive disk. For moving the panel unit, the moving fixture is put on a surface of the panel unit, an external force is applied to the handle to downwardly move the support arm, and the adhesive disk is resiliently deformed to exhaust inner air. A vacuum state inside the adhesive disk is formed to temporarily connect the moving fixture with the panel unit. However, operation of the conventional moving fixture is inconvenient. The adhesive disk cannot effectively connect with the panel unit as the small pressing force is applied to the moving fixture, or the panel unit is easily damaged as the large pressing force is applied to the moving fixture. Therefore, a moving fixture capable of controlling the pressing force to generate the suitable suction force is an important issue of the related panel industry.

SUMMARY OF THE INVENTION

The present invention provides a moving fixture and a related moving apparatus capable of adjusting suction force for solving above drawbacks.

According to the claimed invention, a moving fixture capable of adjusting suction force is disclosed. The moving fixture includes a sucking component, a first supporting component, a second supporting component and a resilient component. A first end of the first supporting component is disposed on the sucking component. The second supporting component is movably disposed on a second end of the first supporting component opposite to the first end. The second supporting component is adapted to move relative to the first supporting component, so as to shift from the second end to the first end. The resilient component is disposed between the first supporting component and the second supporting component. Elasticity coefficient of the sucking component is greater than or equal to elasticity coefficient of the resilient component.

According to the claimed invention, the moving fixture further includes a handle disposed on an end of the second supporting component opposite to the first supporting component.

According to the claimed invention, the second supporting component is a sleeve. An accommodating structure of the sleeve is movably sheathed on the first supporting component.

According to the claimed invention, two ends of the resilient component are respectively connected to the second end of the first supporting component and a bottom of the accommodating structure of the second supporting component.

According to the claimed invention, an aperture of the accommodating structure of the second supporting component is substantially greater than radial dimension of the first supporting component. A depth of the accommodating structure is substantially equal to a length of the first supporting component.

According to the claimed invention, the first supporting component comprises a hollow structure, and a contact surface is disposed on an end of the hollow structure. The second supporting component movably inserts into the hollow structure of the first supporting component.

According to the claimed invention, the second supporting component includes a base and a constraint portion connected to each other. The constraint portion movably inserts into the hollow structure of the first supporting component, and the base is adapted to contact against the contact surface of the hollow structure. A length of the constraint portion is substantially equal to a depth of the hollow structure.

According to the claimed invention, the resilient component is disposed on the constraint portion. Ends of the resilient component are respectively connected to the base and the contact surface of the hollow structure.

According to the claimed invention, a moving apparatus includes a bar and a plurality of moving fixtures. The plurality of moving fixtures is disposed on the bar. Each moving fixture includes a sucking component, a first supporting component, a second supporting component and a resilient component. A first end of the first supporting component is disposed on the sucking component. The second supporting component is movably disposed on a second end of the first supporting component opposite to the first end. The second supporting component is adapted to move relative to the first supporting component, so as to shift from the second end to the first end. The resilient component is disposed between the first supporting component and the second supporting component.

The moving fixture and the related moving apparatus of the present invention have advantages of simple structure and easy operation, and are helpful to effectively control the suction force of the adhesive disk to safely move the panel unit, so as to increase yield rate of the product.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
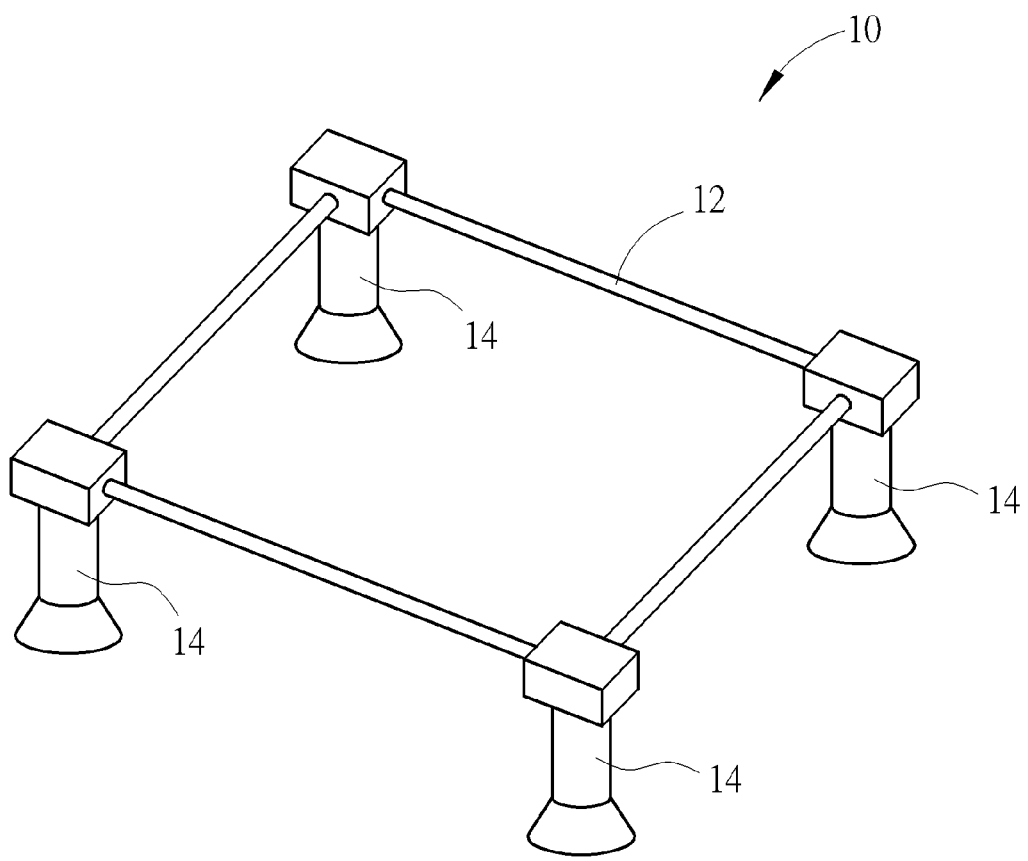
FIG. 1 is a diagram of a moving apparatus according to an embodiment of the present invention.

Please refer to FIG. 1. FIG. 1 is a diagram of a moving apparatus 10 according to an embodiment of the present invention. The moving apparatus 10 is a tool utilized to move panel units, such as the glass substrate, the polarizer, the liquid crystal panel and so on. The moving apparatus 10 includes a bar 12 and a plurality of moving fixtures 14. The bar 12 can be the tetragon form shown in FIG. 1, or the other forms, such as the triangular form and the pentagon form. The plurality of moving fixtures 14 is equally disposed on symmetrical positions of the bar 12, preferably. The panel unit has property of large dimensions, and the moving apparatus 10 utilize the plurality of moving fixtures 14 to connect with different positions of the panel unit by multipoint connection, so as to provide stable connecting force. A shape of the bar 12 and an amount of the moving fixture 14 are not limited the above-mentioned embodiment, and depend on actual demand.

Figure 2:
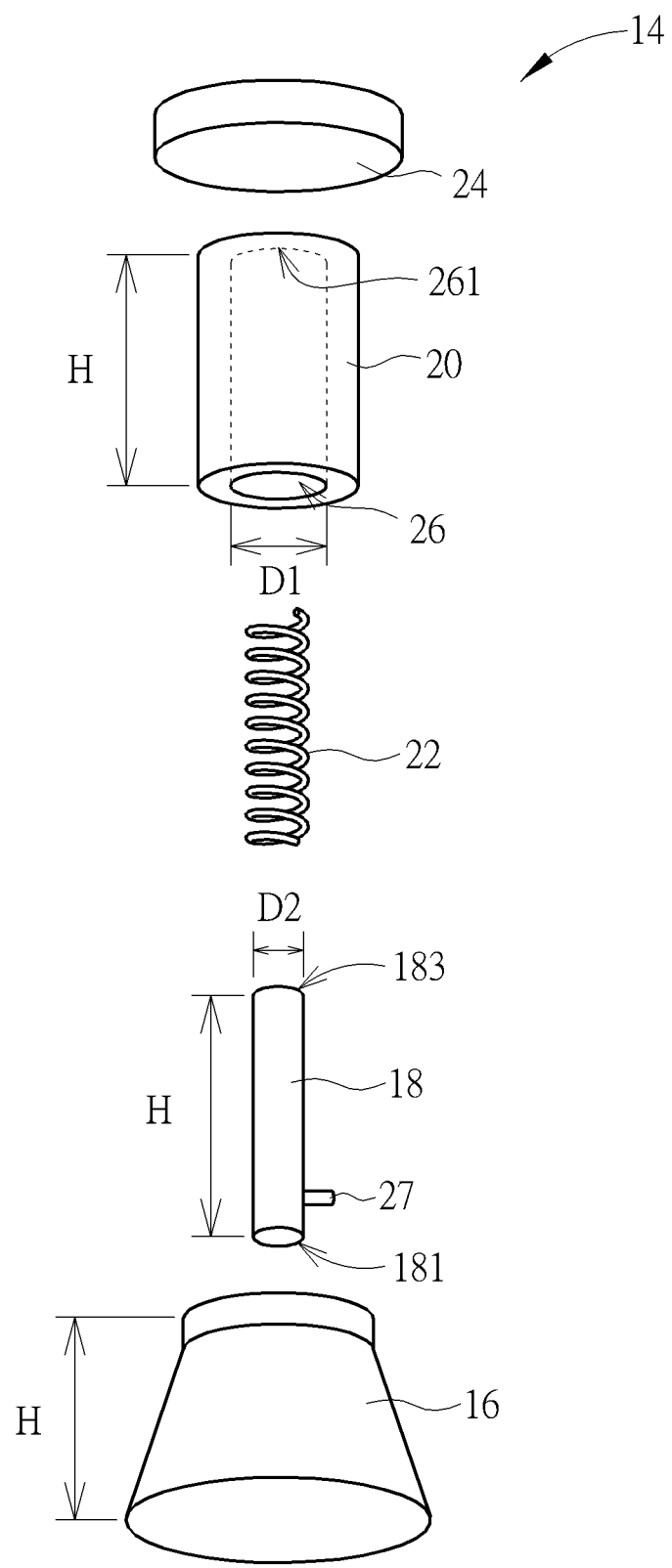
FIG. 2 is an explode diagram of a moving fixture according to a first embodiment of the present invention.

Please refer to FIG. 2. FIG. 2 is an explode diagram of the moving fixture 14 according to a first embodiment of the present invention. The moving fixture 14 includes a sucking component 16, a first supporting component 18, a second supporting component 20, a resilient component 22 and a handle 24. The sucking component 16 is an adhesive disk made of rubber material. Resilient deformation of the sucking component 16 can be used to exhaust air inside the adhesive disk for generating suction force (vacuum suction force is preferred). A first end 181 of the first supporting component 18 is disposed on the sucking component 16. The resilient component 22 is disposed between the first supporting component 18 and the second supporting component 20, and the second supporting component 20 is movably disposed on a second end 183 of the first supporting component 18. The second end 183 is opposite to the first end 181. The handle 24 is disposed on an end of the second supporting component 20 opposite to the first supporting component 18. Further, elasticity coefficient of the sucking component 16 is greater than or equal to elasticity coefficient of the resilient component 22.

As the moving fixture 14 is in use, an external force is applied to the handle 24 to press the second supporting component 20, the second supporting component 20 moves relative to the first supporting component 18 along the vertical direction (which is parallel to a structural axle of the supporting component). Resilient deformation quantity of the resilient component 22 is greater than resilient deformation quantity of the sucking component 16. The resilient component 22 is utilized to absorb the external force for reducing the resilient deformation quantity of the sucking component 16, which is simultaneously generated, so as to decrease the suction force of the sucking component 16 applied to the panel unit. For example, heights of the first supporting component 18, the second supporting component 20 and the sucking component 16 are substantially equal to the same value H. The maximum resilient deformation quantity of the sucking component 16 is equal to H, and can be adapted to generate the maximum suction force F.

When the second supporting component 20 moves relative to the first supporting component 18 to stack the second supporting component 20 with the first supporting component 18, the second supporting component 20 moves from the second end 183 to the first end 181. Due to difference of the above-mentioned elasticity coefficient, the external force is mostly absorbed by the resilient component 22, so that the resilient deformation quantity of the sucking component 16 can be smaller than 0.5H, and the suction force generated by the sucking component 16 can be accordingly smaller than 0.5F. The resilient deformation quantity and the preferred suction force of the sucking component 16 are not limited to the above-mentioned parameters, which correspond to the elasticity coefficient difference between the resilient component 22 and the sucking component 16 and further correspond to relative movement between the first supporting component 18 and the second supporting component 20, and a detailed description is omitted herein for simplicity.

Figure 3:
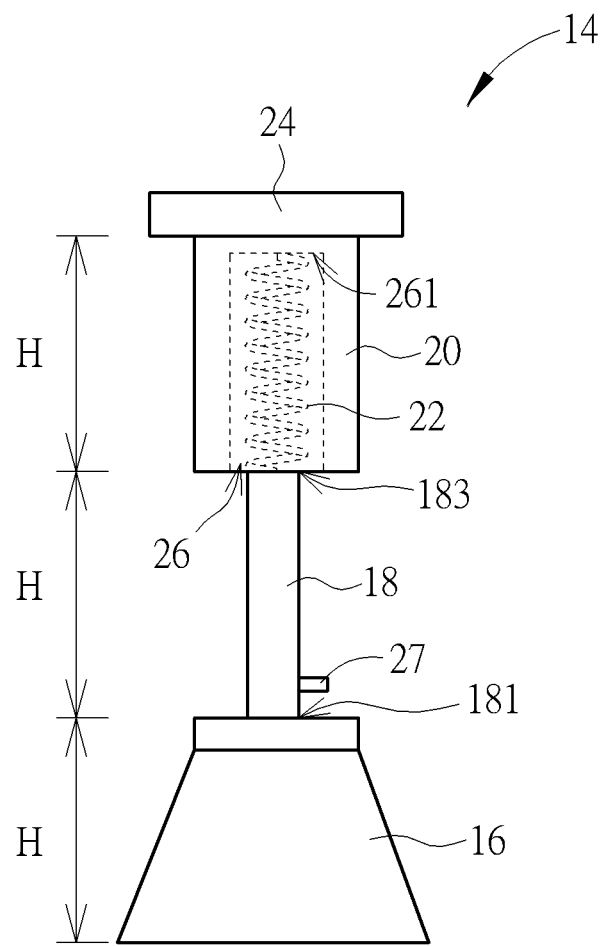
FIG. 3 and FIG. 4 respectively are diagrams of the moving fixture in different operation modes according to the first embodiment of the present invention.
Figure 4:
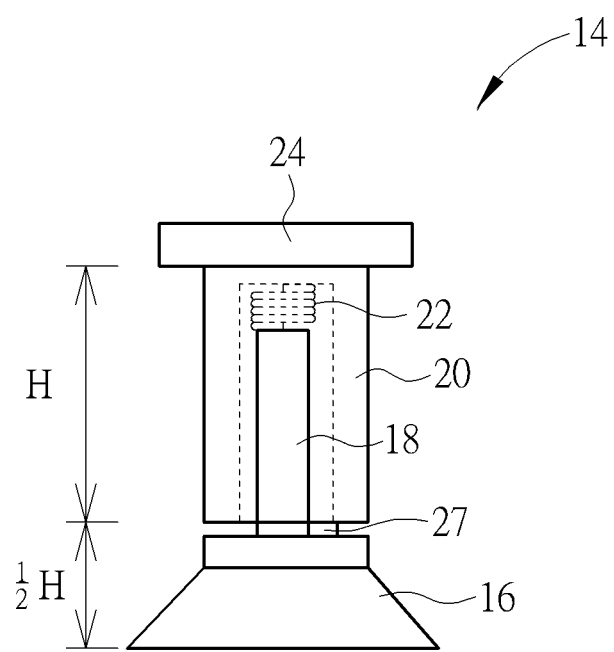

Please refer to FIG. 3 and FIG. 4. FIG. 3 and FIG. 4 respectively are diagrams of the moving fixture 14 in different operation modes according to the first embodiment of the present invention. The first supporting component 18 can be a solid pillar. The second supporting component 20 can be a hollow sleeve. An aperture D1 of an accommodating structure 26 inside the second supporting component 20 is substantially greater than a radial dimension D2 of the first supporting component 18, and a depth of the accommodating structure 26 can be greater than or at least equal to a length (such as the height H) of the first supporting component 18. In addition, two ends of the resilient component 22 are respectively connected to the second end 183 of the first supporting component 18 and a bottom 261 of the accommodating structure 26, and the second supporting component 20 can be sheathed on the first supporting component 18 via the accommodating structure 26 for relatively vertical movement.

As shown in FIG.3, the moving fixture 14 is at an initial mode, the resilient component 22 and the sucking component 16 are not deformed. The structural heights of the resilient component 22 and the sucking component 16 are equal to H. The second supporting component 20 is suspended over the first supporting component 18 via the resilient component 22, and a lower end of the second supporting component 20 aligns with the second end 183 of the first supporting component 18. As shown in FIG. 4, the handle 24 is pressed by the external force, the second supporting component 20 moves relative to the first supporting component 18 downwardly, and the resilient component 22 is compressed. When the lower end of the second supporting component 20 aligns with the first end 181 of the first supporting component 18, the resilient deformation quantity of the sucking component 16 can be substantially equal to 0.5H. Besides, the lower end of the second supporting component 20 further can contact against the constraint portion 27 when aligning with the first end 181; meanwhile, the moving fixture 14 generates the optimum predetermined suction force, and the external force is able to remove from the handle 24. The constraint portion 27 is disposed on a position of an outer surface of the first supporting component 18 adjacent to the first end 181, to constrain the movement of the second supporting component 20 relative to the first supporting component 18.

Figure 5:
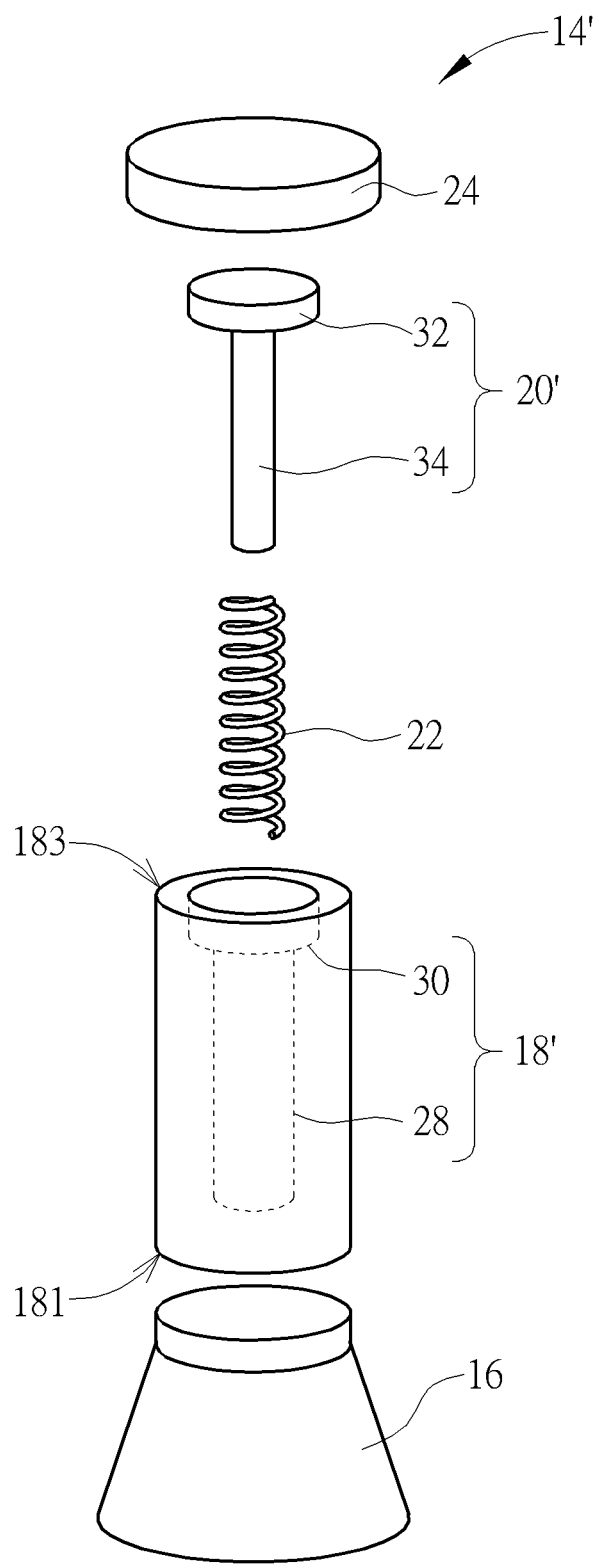
FIG. 5 is an exploded diagram of the moving fixture according to a second embodiment of the present invention.

Please refer to FIG. 5. FIG. 5 is an exploded diagram of the moving fixture 14' according to a second embodiment of the present invention. In the second embodiment, elements having the same numeral as ones of the first embodiment have the same structures and functions, and a detailed description is omitted herein for simplicity. Different between the first embodiment and the second embodiment is that the first supporting component 18' includes a hollow structure 28, and a contact surface 30 is disposed on an end of the hollow structure 28. The second supporting component 20' includes a base 32 and a constraint portion 34 connected to each other. Radial dimension of the base 32 is greater than radial dimension of the constraint portion 34. Ends of the resilient component 22 are respectively connected to the base 32 and the contact surface 30. The resilient component 22 is further disposed on the constraint portion 34. The constraint portion 34 of the second supporting component 20' movably inserts into the hollow structure 28 of the first supporting component 18', and the resilient component 22 is compressed to generate the resilient deformation. A length of the constraint portion 34 is substantially equal to a depth of the hollow structure 28, and dimensions of the base 32 is greater than an aperture of the hollow structure 28. As the second supporting component 20' inserts into the first supporting component 18', the base 32 contacts against the contact surface 30 of the hollow structure 28 to constrain relative movement between the supporting components, and the external force is removed from the handle 24.

Figure 6:
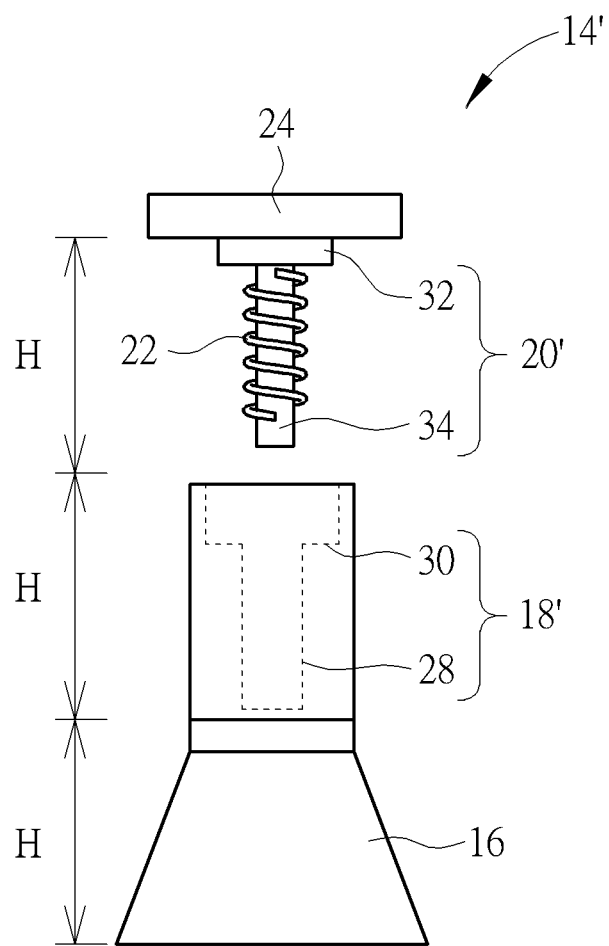
FIG. 6 and FIG. 7 respectively are diagrams of the moving fixture in different operation modes according to the second embodiment of the present invention.
Figure 7:
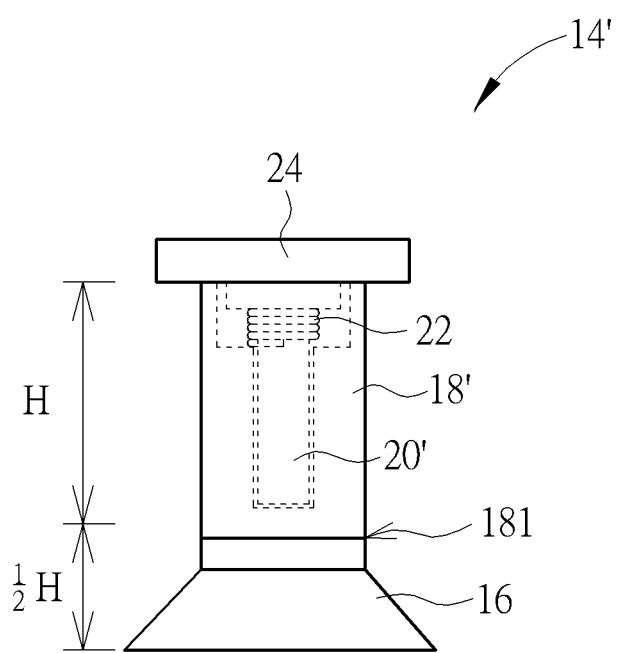

Please refer to FIG. 6 and FIG. 7. FIG. 6 and FIG. 7 respectively are diagrams of the moving fixture 14' in different operation modes according to the second embodiment of the present invention. As shown in FIG. 6, the moving fixture 14' is at the initial mode, the second supporting component 20' is suspended over the first supporting component 18' via the resilient component 22. The constraint portion 34 aligns with an opening of the hollow structure 28, and the sucking component 16 without the external force keeps at the initial structural height. As shown in FIG. 7, the external force is applied to the handle 24 to move the second supporting component 20' downwardly. The constraint portion 34 of the second supporting component 20' inserts into the hollow structure 28 of the first supporting component 18', and the resilient component 22 is compressed to generate the resilient deformation. When the second supporting component 20' completely inserts into the first supporting component 18', such as the lower end of the second supporting component 20' aligns with the first end 181, the relative movement between the first supporting component 18' and second supporting component 20' is equal to H, the resilient deformation quantity of the sucking component 16 can be smaller than 0.5H, and the suction force generated by the sucking component 16 can be accordingly smaller than 0.5F. The optimum predetermined suction force of the sucking component 16 is not limited to the above-mentioned value of 0.5F, which depends on application mode of the product.

In conclusion, the multiple stage moving fixture and the related moving apparatus of the present invention disposes the resilient component between the first supporting component and the second supporting component. The resilient component and the sucking component are compressed to generate the resilient deformation when the moving fixture is pressed. The external force is mostly absorbed by the resilient component, and actual deformation quantity of the sucking component can be smaller than the maximum resilient deformation quantity. Therefore, when the moving apparatus connects with the panel unit by the multipoint connection, the relative movement between the first supporting component and the second supporting component can be utilized to determine quantity of the suction force generated by each moving fixture, so as to prevent the panel unit from damage by overexertion. The present invention further can dispose the piezoelectric component and the speaker on the constraint portion of the first embodiment or the contact surface of the second embodiment. When the second supporting component moves relative to the first supporting component to press the piezoelectric component, the piezoelectric component drives the speaker to generate a prompt audio for reminder that the optimum predetermined suction force is generated by the moving fixture.

The structural heights of the first supporting component, the second supporting component and the sucking component of the present invention are not limited to the above-mentioned proportion illustrated in the first embodiment and second embodiment, which depends on actual demand. Selection of the elasticity coefficient of the sucking component and the resilient component can be set according to design demand. The relative movement of the supporting components drives the sucking component and the resilient component to simultaneously generate the resilient deformation, the resilient deformation quantity of the sucking component is decreased due to the elasticity coefficient difference between the sucking component and the resilient component, and structural movement constraint is utilized to remind that the optimum predetermined suction force is generated by the sucking component. The moving fixture capable of effectively adjusting the sucking force (the vacuum suction force) of the sucking component belongs to scopes of the present invention. Comparing to the prior art, the moving fixture and the related moving apparatus of the present invention have advantages of simple structure and easy operation, and are helpful to effectively control the suction force of the adhesive disk to safely move the panel unit, so as to increase yield rate of the product.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A moving fixture comprising:
   a sucking component being a resilient deformable structure for generating suction force by resilient deformation;
   a first supporting component, a first end of the first supporting component being disposed on the sucking component;
   a second supporting component movably disposed on a second end of the first supporting component opposite to the first end, the second supporting component being adapted to move relative to the first supporting component so as to shift from the second end to the first end; and
   a resilient component disposed between the first supporting component and the second supporting component;
   wherein elasticity coefficient of the sucking component is greater than or equal to elasticity coefficient of the resilient component, the second supporting component moves relative to the first supporting component to accordingly compress the resilient component, and a resilient recovery force of the resilient component drives the first supporting component to deform the sucking component to generate the suction force.

2. The moving fixture of claim 1, further comprising:
   a handle disposed on an end of the second supporting component opposite to the first supporting component.

3. The moving fixture of claim 1, wherein the second supporting component is a sleeve, an accommodating structure of the sleeve is movably sheathed on the first supporting component.

4. The moving fixture of claim 3, wherein ends of the resilient component are respectively connected to the second end of the first supporting component and a bottom of the accommodating structure of the second supporting component.

5. The moving fixture of claim 3, wherein an aperture of the accommodating structure of the second supporting component is substantially greater than radial dimension of the first supporting component, a depth of the accommodating structure is substantially equal to a length of the first supporting component.

6. The moving fixture of claim 1, wherein the first supporting component comprises a hollow structure, a contact surface is disposed on an end of the hollow structure, the second supporting component movably inserts into the hollow structure of the first supporting component.

7. The moving fixture of claim 6, wherein the second supporting component comprises a base and a constraint portion connected to each other, the constraint portion movably inserts into the hollow structure of the first supporting component, and the base is adapted to contact against the contact surface of the hollow structure.

8. The moving fixture of claim 7, wherein a length of the constraint portion is substantially equal to a depth of the hollow structure.

9. The moving fixture of claim 7, wherein the resilient component is disposed on the constraint portion, ends of the resilient component are respectively connected to the base and the contact surface of the hollow structure.

10. A moving apparatus comprising:
a bar; and
a plurality of moving fixtures disposed on the bar, each moving fixture comprising:
   a sucking component being a resilient deformable structure for generating suction force by resilient deformation;
   a first supporting component, a first end of the first supporting component being disposed on the sucking component;
   a second supporting component movably disposed on a second end of the first supporting component opposite to the first end, the second supporting component being adapted to move relative to the first supporting component so as to shift from the second end to the first end; and
   a resilient component disposed between the first supporting component and the second supporting component;
wherein elasticity coefficient of the sucking component is greater than or equal to elasticity coefficient of the resilient component, the second supporting component moves relative to the first supporting component to accordingly compress the resilient component, and a resilient recovery force of the resilient component drives the first supporting component to deform the sucking component to generate the suction force.

11. The moving apparatus of claim 10, wherein the moving fixture further comprises a handle disposed on an end of the second supporting component opposite to the first supporting component.

12. The moving apparatus of claim 10, wherein the second supporting component is a sleeve, an accommodating structure of the sleeve is movably sheathed on the first supporting component.

13. The moving apparatus of claim 12, wherein ends of the resilient component are respectively connected to the second end of the first supporting component and a bottom of the accommodating structure of the second supporting component.

14. The moving apparatus of claim 12, wherein an aperture of the accommodating structure of the second supporting component is substantially greater than radial dimension of the first supporting component, and a depth of the accommodating structure is substantially equal to a length of the first supporting component.

15. The moving apparatus of claim 10, wherein the first supporting component comprises a hollow structure, a contact surface is disposed on an end of the hollow structure, the second supporting component movably inserts into the hollow structure of the first supporting component.

16. The moving apparatus of claim 15, wherein the second supporting component comprises a base and a constraint portion connected to each other, the constraint portion movably inserts into the hollow structure of the first supporting component, and the base is adapted to contact against the contact surface of the hollow structure.

17. The moving apparatus of claim 16, wherein a length of the constraint portion is substantially equal to a depth of the hollow structure.

18. The moving apparatus of claim 16, wherein the resilient component is disposed on the constraint portion, ends of the resilient component are respectively connected to the base and the contact surface of the hollow structure.

\* \* \* \* \*